United States Patent [19]

Watanabe

[11] Patent Number: 5,289,429
[45] Date of Patent: Feb. 22, 1994

[54] ADDRESS DECODER WHICH VARIABLY SELECTS MULTIPLE ROWS AND/OR COLUMNS AND SEMICONDUCTOR MEMORY DEVICE USING SAME

[75] Inventor: Nobuo Watanabe, Yokohama, Japan

[73] Assignee: Kabushiki Kaisha Toshiba, Kawasaki, Japan

[21] Appl. No.: 867,524

[22] Filed: Apr. 13, 1992

[30] Foreign Application Priority Data

Apr. 11, 1991 [JP] Japan ................. 3-079103

[51] Int. Cl.$^5$ ................................. G11C 8/00
[52] U.S. Cl. ........................... 365/230.06; 365/230.03; 365/238.5
[58] Field of Search ............ 365/238.5, 230.03, 230.06

[56] References Cited

U.S. PATENT DOCUMENTS

| | | | |
|---|---|---|---|
| 4,636,986 | 1/1987 | Pinkham | 365/230.08 |
| 4,691,295 | 9/1987 | Erwin et al. | 365/230.03 |
| 4,807,189 | 2/1989 | Pinkham et al. | 365/230.03 |
| 4,926,386 | 5/1990 | Park | 365/238.5 |
| 4,962,486 | 10/1990 | Masuda et al. | 365/238.5 |
| 5,134,589 | 7/1992 | Hamano | 365/238.5 |

*Primary Examiner*—Eugene R. LaRoche
*Assistant Examiner*—Michael C. Kessell
*Attorney, Agent, or Firm*—Foley & Lardner

[57] ABSTRACT

An address decoder comprising a match signal generating circuit responsive to an inputted address signal and an address mask signal to mask any given bits of the inputted address signal, and an address selection signal generating circuit responsive to signals outputted from the match signal generating circuit, for generating a selection signal of a plurality of addresses which have corresponding bit values except for the masked bits. The address decoder can be used as a row address decoder or column address decoder of the semiconductor memory device for selecting a plurality of addresses simultaneously.

8 Claims, 5 Drawing Sheets

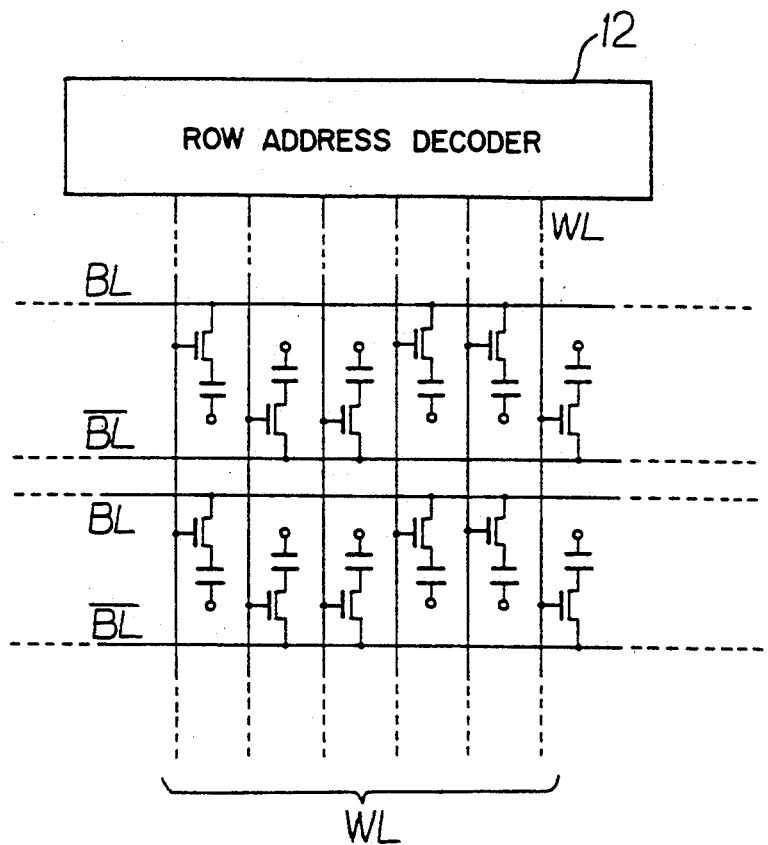
F I G. 5

ADDRESS DECODER WHICH VARIABLY SELECTS MULTIPLE ROWS AND/OR COLUMNS AND SEMICONDUCTOR MEMORY DEVICE USING SAME

BACKGROUND OF THE INVENTION

The present invention relates to an address decoder and a semiconductor memory device using the address decoder, and more specifically to an address decoder used for a semiconductor memory device by which a plurality of data can be written simultaneously to a plurality of cells so as to be suitable for use in an image memory.

In general, in the conventional semiconductor memory device having a plurality of memory cells, an inputted address signal is decoded by an address decoder to select a memory cell designated by an address corresponding to the inputted address signal. In the case of a conventional address decoder, when an address signal $A_3A_2A_1A_0$ is inputted, inverted address value signals $\bar{A}_i$ (i=0, ... 3) are generated on the basis of address value signals, $A_3$, $A_2$, $A_1$, representative of the respective bit values of the inputted address signal and cell selection signals $Y_j$ (j=1, ... 15) corresponding to the address signals $A_3A_2A_1A_0$ are generated by combination of the address value signals $A_i$ and the inverted address value signals $\bar{A}_i$ using AND gates. Here $Y_j$ represents $Y_j=X_3 \cdot X_2 \cdot X_1 \cdot X_0$, where the respective $X_i$ (i=0, ... 3) represent $A_i$ or $\bar{A}_i$.

In the conventional semiconductor memory device including the address decoder as described above, since the inputted address signals correspond one to one to the output signals of the address decoder, when data are written to the cells, a data can be written in only a cell corresponding to each address. Therefore, it takes much time to clear all the data stored in a plurality of cells or in a part of the plural cells; that is, when the same data are written to the plural cells.

To overcome this problem, a flash write circuit as shown in FIG. 1 is incorporated in the semiconductor memory device in order to write the same data to a plurality of cells simultaneously. In the flash write circuit of the prior art semiconductor memory device, there are provided NOT gates 50 arranged for a pair of bit lines BL and $\overline{BL}$, respectively; transistors 52 whose source and drain are connected between the output sides of the NOT gates and the bit lines $\overline{BL}$, respectively; a flash write data line g to which the input sides of the NOT gates 50 are connected in common; and a flash write control line h to which the gates of the transistors 52 are connected in common. In this circuit, when a control signal for flash write is transmitted through the control line h, the transistors 52 are turned on, so that data to be written transmitted through the data line g are given to the bit lines $\overline{BL}$ of pairs of the bit lines via the NOT gates 50 and the transistors 52. In other words, data are written to the bit lines without use of a column address decoder 10. In this operation, if one word line e.g., $WL_i$) is selected, the same data are written to all the memory cells connected to the word lines $WL_i$ As described above, in the prior art semiconductor memory device, the flash write function is the simultaneous data writing operation for each row address unit. Therefore, it is possible to clear all the data of the memory or clear the data for each row address unit at high speed. However, there exists a problem in that it is impossible to write data to a part of cells arranged in the column direction at high speed, that is, to implement partial data erasure.

SUMMARY OF THE INVENTION

The object of the present invention is to provide an address decoder and a semiconductor memory device which use the address decoder by which data can be written to a part of a plurality of cells simultaneously.

According to one aspect of the present invention, there is provided an address decoder comprising: match signal generating means responsive to an inputted address signal and an address mask signal applied externally to mask any given bits of the inputted address signal, having a first logical gate circuit for generating an irrespective value to a value of the inputted address when a bit value is a designated mask value and generating an inputted address value as it is when the bit value is a nondesignated mask value, and a second logical gate circuit for generating an irrespective value to the value of the inputted address when a bit value is a designated mask value and generating an inverted inputted address value when the bit value is a nondesignated mask value, and address selection signal generating means responsive to a pair of the signals outputted from said first logical gate circuit and said second logical gate circuit, for generating a plurality of address selection signals for selecting addresses having same values at bits except masked bits as the inputted address signal.

According to another aspect of the present invention, there is provided a semiconductor memory cell device comprising: a memory cell array; and a column address decoder including: match signal generating means responsive to an inputted column address signal to select a column of said memory cell and an column address mask signal applied externally to mask any given bits of the inputted column address signal, having a first logical gate circuit for generating an irrespective value to a value of the inputted column address when a bit value is a designated mask value and generating an inputted column address value as it is when the bit value is a nondesignated mask value, and a second logical gate circuit for generating an irrespective value to the value of the inputted column address when a bit value is a designated mask value and generating an inverted inputted column address value when the bit value is a nondesignated mask value, and column address selection signal generating means responsive to a pair of the signals outputted from said first logical gate circuit and said second logical gate circuit, for generating a plurality of column address selection signals for selecting column addresses having same values at bits except masked bits as the inputted column address signal.

In the address decoder according to the present invention, where there are bit values to be masked, selection signals for selecting a plurality of addresses having the same bit values other than the bit values to be masked are outputted from an address decoder. By using the outputted address decoder signals as write cycles, it is possible to write data to a plurality of cells simultaneously.

BRIEF DESCRIPTION OF THE DRAWINGS;

In the attached drawings:

FIG. 5 is a circuit diagram showing the semiconductor memory device in which the decoder shown in FIG. 2 is incorporated as a row address decoder.

DETAILED DESCRIPTION OF THE PREFERRED EMBODIMENTS

Figure 1:
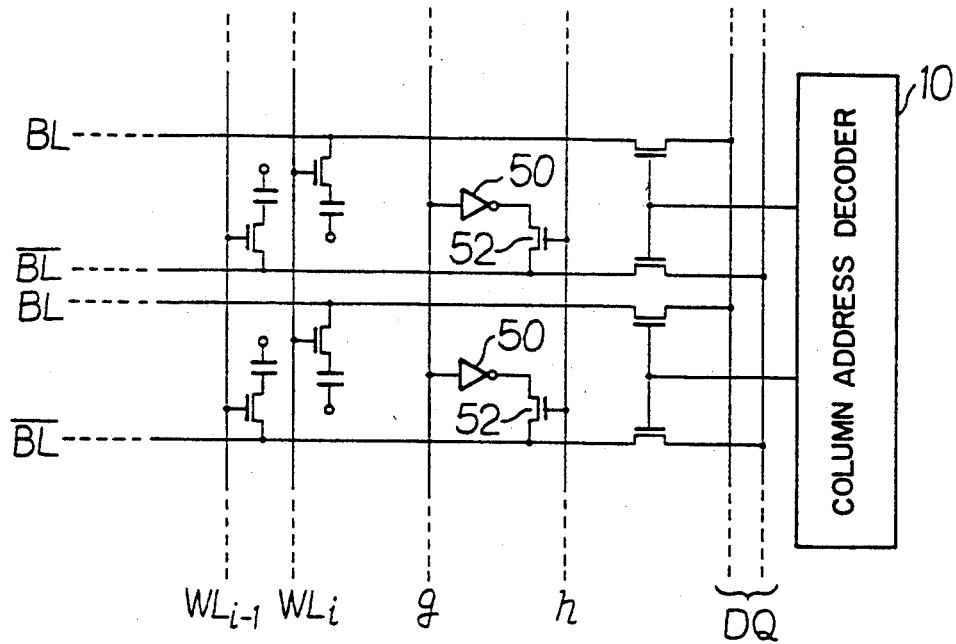
FIG. 1 is a circuit diagram showing the prior art semiconductor memory device in which a flash write circuit is incorporated.
Figure 2:
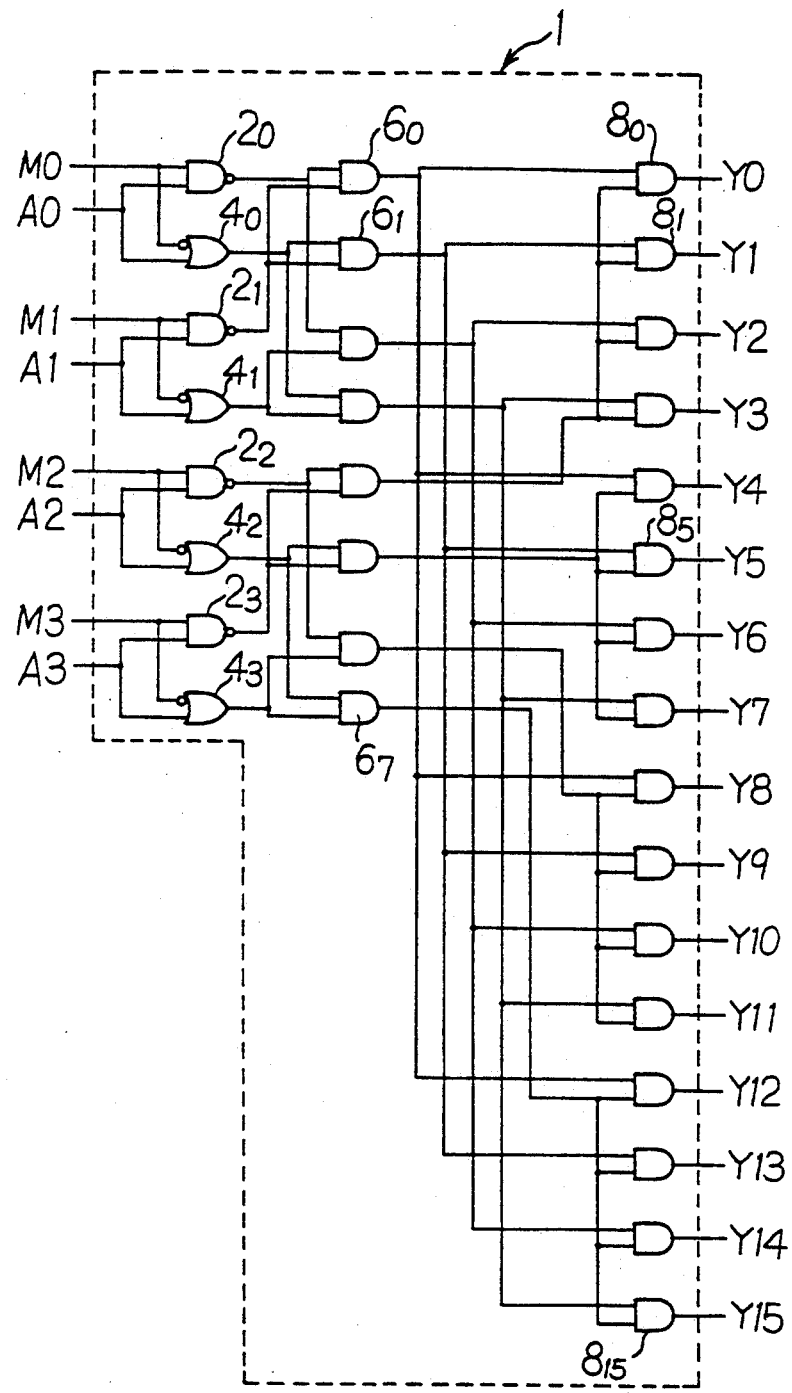
FIG. 2 is a circuit diagram showing an example of an address decoder of the semiconductor memory device according to the present invention.

FIG. 2 is a circuit diagram showing an embodiment of an address decoder 1 according to the present invention, which is used for a semiconductor memory device. This address decoder 1 outputs at least one selection signal of 16 ($=2^4$)-piece selection signals $Y_1, Y_2, \ldots Y_{15}$ on the basis of a 4-bit address signal $A_3A_2A_1A_0$ and an address mask signal $M_3M_2M_1M_0$ outputted from address mask signal generating means (not shown). This circuit comprises 4 NAND gates $2_0, \ldots 2_3$; 4 OR gates $4_0, \ldots 4_3$; 8 AND gates $6_0, \ldots 6_7$; and 16 AND gates $8_0, \ldots 8_{15}$. The respective mask values $M_i$ ($i=0, \ldots 3$) of the address mask signal represent whether the corresponding bit values $A_i$ are masked or not in such a way that $M_i=1$ when not masked and $M_i=0$ when masked. when not The NAND gates $2_i$ ($i=0, \ldots 3$) are activated in response to the bit values $A_i$ of the address signal and the corresponding address mask values $M_i$; and the OR gates $4_i$ ($i=0, \ldots 3$) are activated in response to the bit values $A_i$ and the inverted values $\overline{M}_i$ of the corresponding address mask values $M_i$. Therefore, when the bit values $A_i$ are not masked (i.e., when $M_i=$"1"), the outputs of the NAND gates $2_i$ and OR gates $4_i$ are $\overline{A}_i$ and $A_i$, respectively; and when masked, the outputs of the NAND gates $2_i$ and OR gates $4_i$ are "1", respectively.

The truth table the logic circuit composed of the Nand gate 2i and the OR gate 4i is shown in Table 1. Where, C denotes output of Nand gate 2i and D denotes output of OR gate 4i.

TABLE 1

| A | M | C | D |
|---|---|---|---|
| 0 | 0 | 1 | 1 |
| 1 | 0 | 1 | 1 |
| 0 | 1 | 1 | 0 |
| 1 | 1 | 0 | 1 |

By combining these outputs of the NAND gates $2_0, \ldots 2_3$ and those of the OR gates $4_0, \ldots 4_3$ by means of the AND gates $6_0, \ldots 6_7$ and the AND gates $8_0, \ldots 8_{15}$, it is possible to output at least one selection signal $Y_i$ ($i=0, \ldots 15$) from the decoder 1. In other words, when all the bit values $A_i$ ($i=0, \ldots 3$) are not masked, selection signals $Y_j$ for selecting addresses corresponding to the address signals $A_3A_2A_1A_0$ can be outputted from the decoder 1, where j can be expressed as $$j = A_3 \cdot 2^3 + A_2 \cdot 2^2 + A_1 \cdot 2 + A_0$$

Where there exist bit values to be masked, selection signals for selecting a plurality of addresses having the same bits other than the bit values to be masked are outputted from the decoder 1. For instance, when the bit values $A_0$ is masked (i.e., $M_0=0$), two selection signals $Y_j$ and $Y_{j1}$ are outputted from the decoder 1, where j and $j_1$ are expressed as $$j = A_3 \cdot 2^3 + A_2 \cdot 2^2 + A_1 \cdot 2$$

$$j_1 = j + 1$$

Furthermore, when the bit values $A_0$ and $A_1$ are masked, for instance, 4 selection signals $Y_j$, $Y_{j1}$, $Y_{j2}$, $Y_{j3}$ are outputted from the decoder 1, where j, $j_1$, $j_2$, $j_3$ are expressed as $$j = A_3 \cdot 2^3 + A_2 \cdot 2^2$$

$$j_1 = j + 1$$

$$j_2 = j + 2$$

$$j_3 = j + 3$$

In the above description, a 4-bit address signal has been explained by way of an example. However, without being limited to the above description, it is of course possible to apply the present invention to any-bit address signals.

Figure 6:
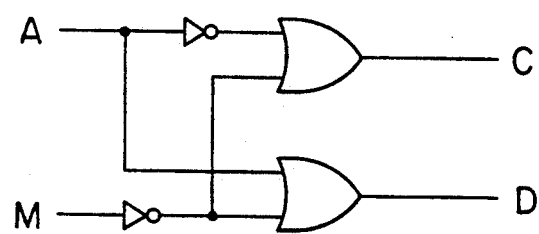
FIG. 6 is a circuit showing other type of an input stage of the address decoder according to the present invention.

Other types of input stages can be used. FIG. 6 is a circuit diagram showing such an input stage.

This input stage outputs following identical logic for the same inputs as described in Table 2.

TABLE 2

| A | M | C | D |
|---|---|---|---|
| 0 | 0 | 1 | 1 |
| 1 | 0 | 1 | 1 |
| 0 | 1 | 1 | 0 |
| 1 | 1 | 0 | 1 |

Figure 3:
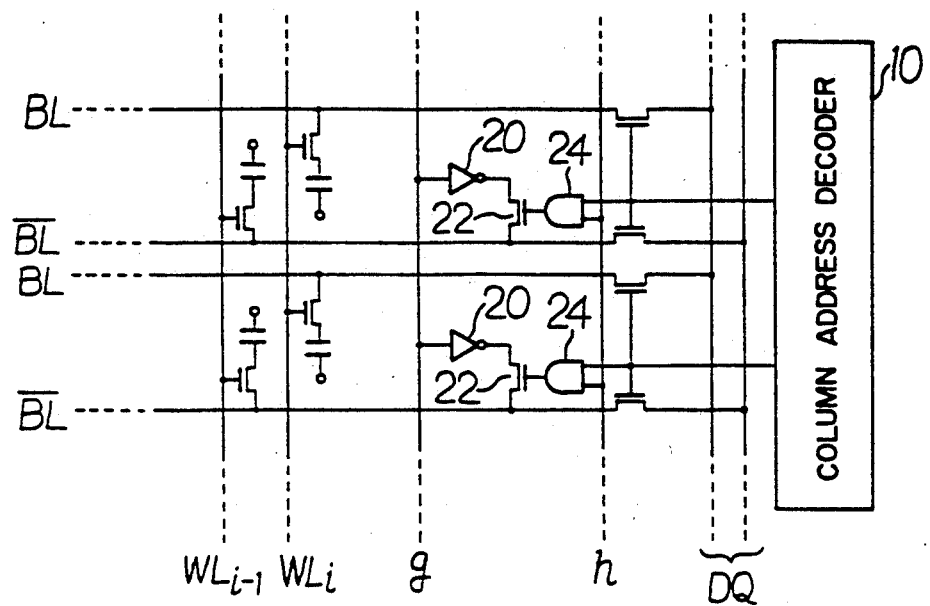
FIG. 3 is a circuit diagram showing an embodiment of the semiconductor memory device according to the present invention.

FIG. 3 shows an embodiment of the semiconductor memory device according to the present invention, in which the address decoder shown in FIG. 2 is used as a column address decoder 10. In this embodiment, the semiconductor memory device comprises a cell array composed of memory cells arranged in matrix form, whose addresses can be designated by word lines $WL_i$ selected by a row address decoder (not shown) and a pair of bit lines BL and $\overline{BL}$ selected by a column address decoder 10, and a flash write circuit. The flash write circuit provided for each pair of bit lines comprises a NOT gate 20, a gate transistor 22, an AND gate 24, a flash write data line g, and a flash write control line h. The flash write data line g is connected to the input side of the NOT gates 20, and the source and drain of the gate transistor 22 are connected between the output side of the NOT gate 20 and the bit line $\overline{BL}$. Furthermore, an output signal of the AND gate 24 is applied to the gate electrode of the gate transistor 22. The input terminals of the AND gates 24 are connected to the flash write control line h and the column address decoder 10 to receive signals, respectively.

The operation of this embodiment will be described hereinbelow. Logical product signals of the control signal transmitted through the control line h and output signals of the column address decoder 10 are obtained by the AND gate 24. When transistors 22 are turned on in response to the logical product signals applied to the gates of the transistors 22, data transmitted through the data line g are written in the bit lines. At this moment, when one word line is selected, the transistors of the cells connected to the selected word line are turned on, and a flash write data is written to the cells from the bit lines selected by the selection signals outputted from the column address decoder 10. Accordingly, it is possible to realize the column mask function such that a data can be written to only a part of cells arranged in a row for implementing the flash write.

Figure 4:
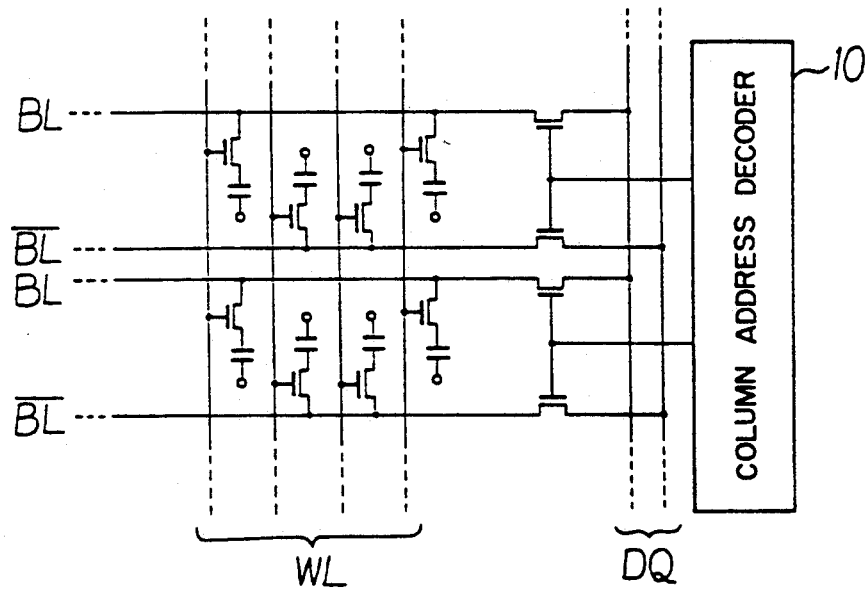
FIG. 4 is a circuit diagram showing the semiconductor memory device in which the decoder shown in FIG. 2 is incorporated as a column address decoder.

Furthermore, in the case where the buffer driving capability of the DQ lines (input/output lines) is sufficiently large, it is possible to realize the column mask or the flash write function by using the decoder shown in FIG. 2 as the column address decoder 10 in the semiconductor memory device (e.g., DRAM) having no flash write circuit, as shown in FIG. 4.

Furthermore, it is possible to implement the flash write to cells arranged in a plurality of rows at the same time by using the decoder shown in FIG. 2 as a row address decoder 12, as shown in FIG. 5.

Furthermore, in the case of the video RAM (VRAM), the address mask signals can be obtained by designating them by $\overline{CAS}$(column address signals) at the flash write cycles.

As described above, in the semiconductor memory device according to the present invention, it is possible to write data to a plurality of cells simultaneously.

What is claimed is:

1. An address decoder comprising:
   match signal generating means responsive to an inputted address signal and an address mask signal applied externally to mask any given bits of the inputted address signal, having a first logical gate circuit for generating a value irrespective of a value of the inputted address when a bit value is a designated mask value and generating an inputted address value as it is when the bit value is a nondesignated mask value, and a second logical gate circuit for generating a value irrespective of the value of the inputted address when a bit value is a designated mask value and generating an inverted inputted address value when the bit value is a nondesignated mask value, and
   address selection signal generating means responsive to a pair of the signals outputted from said first logical gate circuit and said second logical gate circuit, for generating a plurality of address selection signals for selecting addresses having same values at bits except masked bits as the inputted address signal.

2. The address decoder of claim 1, wherein the address mask signal $M_{n-1} \ldots M_0$ includes an address mask value $M_{i-1}$ indicative of whether i-th (i=1, ... n) bit address mask signal value $A_{i-1}$ counted from the least significant bit of n-bit address signal $A_{n-1} \ldots A_0$ is masked or not.

3. The address decoder of claim 2, wherein said selection signal generating means outputs a selection signal for selecting an address corresponding to the address signal $A_{n-1} \ldots A_0$ when there exists no bit value to be masked.

4. The address decoder of claim 1, wherein said first gate circuit is a logical multiplication gate and said second gate circuit is a logical sum gate.

5. The address decoder of claim 1, wherein said first and second gate circuits are logical sum gates.

6. A semiconductor memory cell device comprising:
   a memory cell array; and
   a column address decoder including:
   match signal generating means responsive to an inputted column address signal to select a column of said memory cell array and a column address mask signal applied externally to mask any given bits of the inputted column address signal, having a first logical gate circuit for generating a value irrespective of a value of the inputted column address when a bit value is a designated mask value and generating an inputted column address value as it is when the bit value is a nondesignated mask value, and a second logical gate circuit for generating a value irrespective of the value of the inputted column address when a bit value is a designated mask value and generating an inverted inputted column address value when the bit value is a nondesignated mask value, and
   column address selection signal generating means responsive to a pair of the signals outputted from said first logical gate circuit and said second logical gate circuit, for generating a plurality of column address selection signals for selecting column addresses having same values at bits except masked bits as the inputted column address signal.

7. A semiconductor memory device of claim 6 further comprising:
   a flash write means for activating bit line pairs of selected columns responsive to said column address selection signal.

8. A semiconductor memory cell device comprising:
   a memory cell array; and
   a row address decoder including:
   match signal generating means responsive to an inputted row address signal to select a row of said memory cell array and a row address mask signal applied externally to mask any given bits of the inputted row address signal, having a first logical gate circuit for generating a value irrespective of a value of the inputted row address when a bit value is a designated mask value and generating an inputted row address value as it is when the bit value is a nondesignated mask value, and a second logical gate circuit for generating a value irrespective of the value of the inputted row address when a bit value is a designated mask value and generating an inverted inputted row address value when the bit value is a nondesignated mask value, and
   row address selection signal generating means responsive to a pair of the signals outputted from said first logical gate circuit and said second logical gate circuit, for generating a plurality of row address selection signals for selecting row addresses having same values as bits except masked bits as the inputted row address signal.

* * * * *